United States Patent [19]

Nillesen

[11] Patent Number: 5,349,548
[45] Date of Patent: Sep. 20, 1994

[54] NON-INTEGRAL DELAY CIRCUIT

[75] Inventor: Antonius H. H. J. Nillesen, Eindhoven, Netherlands

[73] Assignee: U.S. Philips Corporation, New York, N.Y.

[21] Appl. No.: 61,358

[22] Filed: May 13, 1993

[30] Foreign Application Priority Data

Jun. 26, 1992 [EP] European Pat. Off. ........ 92201894.0

[51] Int. Cl.$^5$ .............................................. G06F 15/31
[52] U.S. Cl. .............................. 364/724.1; 364/724.01
[58] Field of Search .................. 364/724.10, 724.01, 364/724.16, 734; 358/38

[56] References Cited

U.S. PATENT DOCUMENTS

| | | | |
|---|---|---|---|
| 3,813,529 | 5/1974 | Bartlett | 364/724.10 |
| 4,074,308 | 2/1978 | Gibson | 358/38 |
| 4,694,414 | 9/1987 | Christopher | 364/724.10 |
| 4,760,542 | 7/1988 | Mehrgardt et al. | 364/724 |
| 5,257,026 | 10/1993 | Thompson et al. | 364/724.10 |
| 5,258,939 | 11/1993 | Johnstone et al. | 364/724.10 |

OTHER PUBLICATIONS

M. Herrmann, "Digitaler Fernsehempfanger mit unverkoppeltem Systemtakt", Fernseh Und Kino Technik, vol. 44, No. 4, 1991, pp. 282–289.

P. Knutson et al., "An Optimal Approach To Digital Raster Mapper Design", IEEE Transactions on Consumer Electronics, vol. 37, No. 4, Nov. 1991, pp. 746–752.

Primary Examiner—Tan V. Mai
Attorney, Agent, or Firm—Edward W. Goodman

[57] ABSTRACT

A non-integral delay circuit for delaying a digital signal by a selectable fraction ($\delta$) of a sampling period of the digital signal includes a first differentiator (S3) to obtain a first differential signal (F1) having a first phase characteristic with respect to the digital signal, a second differentiator (D) to obtain a second differential signal (F2) having a second phase characteristic with respect to the digital signal, the first and second phase characteristics differing from each other, a mixer (MIX) for combining the first (F1) and second (F2) differential signals in dependence on the selectable fraction ($\delta$) to obtain a phase-adjusted correction signal, and an adder (A9) which adds a product (M3) of the selectable fraction ($\delta$) and the phase-adjusted correction signal to the digital signal, to obtain the digital signal delayed by the selectable fraction ($\delta$) of the sampling period of the digital signal.

6 Claims, 3 Drawing Sheets

NON-INTEGRAL DELAY CIRCUIT

BACKGROUND OF THE INVENTION

1. Field of the Invention

The invention relates to a delay circuit for delaying a digital signal by a selectable fraction of the sampling period of the digital signal.

2. Description of the Related Art

Such a delay circuit is disclosed in European Patent EP-B-0,181,953, corresponding to U.S. Pat. No. 4,760,542. In FIG. 3 of that patent, a sample halfway between two original samples is obtained by means of an averager. The averager comprises a peaking circuit to improve the frequency characteristic of the averager. Subsequently, a sample at a selectable position between one of the original samples and the obtained sample halfway between the two original samples is obtained by multiplying the difference between the sample halfway and the one original sample by a factor which depends on the desired delay, and by adding the result to the one original sample.

The frequency characteristic of this delay circuit appears to depend too much on the magnitude of the selected delay, which causes distortions in the output signal of the delay circuit. Moreover, EP-B-0,181,953 provides no indications of the way in which the peaking factor should be chosen.

U.S. Pat. No. 4,694,414 discloses a delay interpolation filter which provides for amplitude and phase compensation, in which a two-point linear interpolation filter imparts delay to an input signal. The delay is proportional to the value of a delay control signal. In an attempt to minimize errors in both amplitude and phase, a correction term is added to the delayed signal. The correction signal is provided by applying the input signal to a further filter and multiplier connected in cascade. The further filter is a linear phase filter having a zero response at zero frequency and a delay equal to an odd multiple of the sampling period Ts of the input signal. The multiplier is controlled so as to vary the amplitude of the compensating signal as a non-linear function of the delay control signal in order to provide maximum amplitude compensation at delays corresponding to odd multiples of Ts/2 and zero amplitude compensation at delays equal to integral multiples of Ts.

FIG. 9 of the above-mentioned US Patent shows that the amplitude error at 5 MHz is $-3$ dB when the signal is sampled at a 14.4 MHz clock frequency, which is too large when the interpolation filter is to be used in video applications with a dynamically changing delay, as is required when a signal, which has originally been sampled at a 13.5 MHz sampling frequency, is interpolated to another sampling frequency. When it is attempted to decrease the amplitude error, the corresponding correction of the phase is complicated. Moreover, the non-linear function used to vary the amplitude of the compensating signal, yields results which are difficult to predict.

SUMMARY OF THE INVENTION

It is, inter alia, an object of the invention to provide a non-integral delay circuit whose frequency characteristic is less dependent on the magnitude of the selected delay.

For this purpose, the invention provides a delay circuit for delaying a digital signal by a selectable fraction ($\delta$) of a sampling period of said digital signal, comprising first means for differentiating said digital signal to obtain a first differential signal (F1) having a first phase characteristic with respect to said digital signal, second means for differentiating said digital signal to obtain a second differential signal (F2) having a second phase characteristic with respect to said digital signal, said first and second phase characteristics differing from each other, means for combining said first (F1) and second (F2) differential signals in dependence on said selectable fraction ($\delta$) to obtain a phase-adjusted correction signal, and means for adding a product of said selectable fraction ($\delta$) and said phase-adjusted correction signal to said digital signal, to obtain said digital signal delayed by said selectable fraction ($\delta$) of the sampling period of said digital signal. Advantageous embodiments are defined in the subclaims.

The invention is based on observations of the difference between a unit impulse input signal and the corresponding output signal of an ideal but very expensive delay circuit which comprises an interpolation filter having a very large number of taps, for several values of the delay. These observations lead to the following conclusions:

- the amplitude transfer characteristic of this difference appears to be a substantially linear function of the frequency;
- the amount of the difference appears to vary substantially linearly with the amount of the delay; and
- the slope of the phase characteristic of the difference appears to vary substantially linearly with the amount of the delay.

Accordingly, to obtain a sample which has been delayed by a fraction of the sampling period, a correction term should be added to the nearest input sample. The nearest input sample is that input sample which is nearest to the output sample of the non-integral delay circuit. The correction term is preferably defined by the formula $\delta.[d_1.F1+d_2.F2]$, in which $\delta$ is the required delay, $d_1$ is a factor which increases linearly with $\delta$, and $d_2$ is a factor which decreases linearly with $\delta$. For example, $d_1$ equals $\delta$ and $d_2$ equals $1-\delta$. F1 and F2 are differentiated samples obtained by filters having different phase characteristics. The phase of the correction term is thus determined by the factor $[d_1.F1+d_2.F2]$, by which it is ensured that the phase characteristic of the correction term varies substantially linearly with the amount of the delay $\delta$, between the phase characteristic of F1 and the phase characteristic of F2. When F1 and F2 have corresponding amplitude characteristics in the relevant frequency band, the amplitude of the factor $[d_1.F1+d_2.F2]$ is substantially independent of $d_1$ and $d_2$, so that the amplitude of the whole correction term $\delta.[d_1.F1+d_2.F2]$ is solely determined by $\delta$ and is thus more precisely controllable. More specifically, the amplitude of the whole correction term $\delta.[d_1.F1+d_2.F2]$ then increases linearly with $\delta$.

These conclusions make it possible to create a very simple delay circuit which needs only a low number of taps, but which has a performance comparable to that of a very expensive interpolation filter having about 100 taps.

In accordance with a first aspect of the invention, F1 is the difference between the nearest input sample and an interpolated sample halfway between the two nearest samples, while F2 is a differentiated sample obtained by an asymmetrical filter having an odd number of coefficients. An asymmetrical filter is herein defined to be a filter having an asymmetrical impulse response. The two nearest samples are the input samples at opposite sides of the output sample of the non-integral delay circuit. The phase characteristic of F1 starts at a phase shift $ps=\pi/2$ for frequency $f=0$ and approximately linearly increases along a line which ends at $ps=3\pi/4$ for $f=fs/2$, where fs is the sampling frequency. The phase characteristic of F2 shows a constant phase shift $ps=\pi/2$.

In accordance with a second and preferred aspect of the invention, F1 is the difference between a nearest input sample and an interpolated sample halfway between two nearest samples, while F2 is a differentiated sample obtained by an asymmetrical filter having an even number of coefficients. Again, the phase characteristic of F1 starts at a phase shift $ps=\pi/2$ for frequency $f=0$ and approximately linearly increases along a line which ends at $ps=3\pi/4$ for $f=fs/2$. The phase characteristic of F2 also starts at $ps=\pi/2$ for $f=0$, but approximately linearly decreases to $ps=0$ for $f=fs/2$. The first and second aspects show very good frequency responses for video signals sampled at 13.5 MHz; their frequency responses appear to be flat up to about three quarters of the half sampling frequency.

In accordance with a very simple third aspect of the invention, intended for smaller bandwidths up to about one half of the half sampling frequency, F1 is the difference between the two nearest samples, while F2 is a differentiated nearest sample obtained by an anti-symmetrical filter having an odd number of coefficients. The phase characteristic of F1 starts at $ps=\pi/2$ for $f=0$, and approximately linearly decreases to $ps=0$ for $f=fs/2$. As with the first aspect, the phase characteristic of F2 shows a constant phase shift $ps=\pi/2$.

In accordance with a fourth aspect of the invention, F1 is a differentiated sample obtained by an anti-symmetrical filter having an even number of coefficients, while F2 is a delayed version of F1. In this fourth aspect, $d_1$ equals $1+\delta$ and $d_2$ equals $1-\delta$. The phase characteristic of F1 starts at $ps=\pi/2$ for $f=0$, and approximately linearly decreases to $ps=0$ for $f=fs/2$. The phase characteristic of F2 starts at $ps=\pi/2$ for $f=0$, and approximately linearly increases to $ps=\pi$ for $f=fs/2$.

These and other aspects of the invention will be apparent from and elucidated with reference to the embodiments described hereinafter.

DESCRIPTION OF THE PREFERRED EMBODIMENTS

Figure 1:
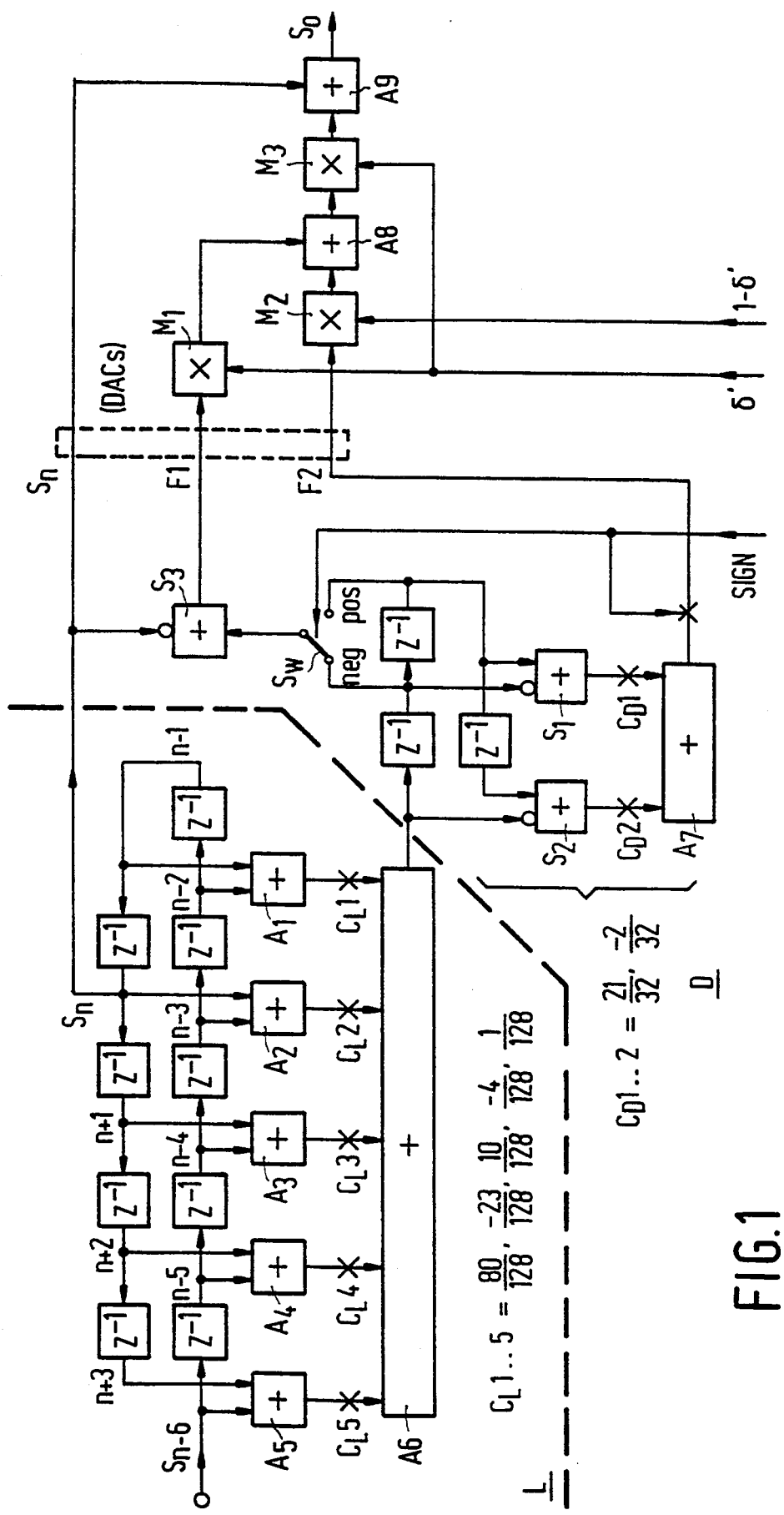
FIG. 1 shows an embodiment of a delay circuit in accordance with the above-mentioned first aspect of the invention.

In the delay circuit shown in FIG. 1, an input signal is applied to a low-pass filter L, which comprises a delay line of 9 cascaded delay sections $Z^{-1}$, thereby providing 10 taps. Five adders A5 through A1 each sum two taps of this delay line. The outputs of these adders A5 through A1 are multiplied by respective coefficients $C_L5$ through $C_L1$, and thereafter summed in a final adder A6 to provide a finite impulse response filtered signal. Since each time two taps are combined by the adders A5 through A1, the low-pass filter has an even number of coefficients, which results in a delay of half a sample period. The output of the sixth delay section furnishes an unfiltered signal Sn.

The finite impulse response filtered signal supplied by the low-pass filter L is applied to a differentiator D which comprises a delay line of 3 cascaded delay sections $Z^{-1}$, thereby providing 4 taps. Two subtracters S2, S1 each subtract two taps of this delay line from each other. The outputs of these subtracters S2, S1 are multiplied by respective coefficients $C_D2$ and $C_D1$, and thereafter summed in a final adder A7 to provide a differentiated signal, which corresponds to a first derivative of the unfiltered signal Sn. The differentiated signal is multiplied by the sign of the delay $\delta$; the multiplied differentiated signal will hereinafter be referred to as F2.

The second and third taps of the delay line of the differentiator D are connected to switching contacts of a switch Sw which is controlled by the sign of the delay $\delta$. A common contact of the switch Sw is connected to a non-inverting input of a subtracter S3, whose inverting input receives the unfiltered signal Sn. The output signal of the subtracter S3 will hereinafter be referred to as F1. Thus, F1 is the difference between the unfiltered signal Sn and the finite impulse response filtered signal delayed by one or two clock periods. The use of a filtered signal having a half sampling period delay to create F1 provides a more precisely defined starting point for the creation of a signal delayed by a selectable fraction of the sampling period of the digital signal than when F1 is more simply obtained by subtracting two successive input samples in the manner described hereinafter with reference to FIG. 3.

Finally, the signals F1 and F2 are combined in the ratio $\delta':(1-\delta')$ by multipliers M1 and M2 and an adder A8; $\delta'$ is the magnitude of the delay $\delta$. In the embodiment of FIG. 1, $\delta=0$ indicates no delay and $\delta=1$ indicates that the output sample of the low-pass filter L is taken, which output sample is halfway between two input samples. The output signal of the adder A8 is multiplied by $\delta'$ in a multiplier M3, and thereafter added as a correction signal to the unfiltered signal Sn so as to form a delayed output signal So. If desired, this final section of the delay circuit may be analog, in which case digital-to-analog converters (DACs) convert the signals Sn, F1 and F2 before the adder A9 and the multipliers M1 and M2. Inserting DACs at the indicated position has the advantage that simple hold circuits without reconstruction filter and without (sin x)/x correction filter would suffice, while a DAC at the output of the final adder A9 would need both a reconstruction filter and a (sin x)/x correction filter, which are difficult to design in CMOS technology. The hold circuits furnish the required values of Sn, F1 and F2 during the whole sampling period without additional elements being needed.

The operation of the delay circuit can be described by the formula $So=Sn+\delta.[\delta.F1+(1-\delta).F2]$. The amplitude of the correction signal is a linear function of the delay $\delta$. The phase of the correction signal is obtained by a linear combination of the signals F1 and F2 in the ratio $\delta: (1-\delta)$, which appeared to yield surprisingly good results.

It will be evident that alternative embodiments are obtained when the brackets are removed or rearranged in the above formula, for example, like $S_o = S_n + \delta \cdot [F2 + \delta \cdot (F1 - F2)]$, which saves one multiplier but requires an additional subtracter. The combination of a low-pass filter L and a subsequent simple differentiator D having an even number of coefficients, is equivalent to an asymmetrical filter having an odd number of coefficients and an amplitude characteristic which is more or less equal to the amplitude characteristic of F1 within the desired passband.

In this embodiment of the invention, the low-pass filter coefficients $C_L1$ through $C_L5$ are 80/128, −23/128, 10/128, −4/128, and 1/128, respectively. The differentiator coefficients $C_D1$ and $C_D2$ are 21/32 and −2/32, respectively.

Figure 2:
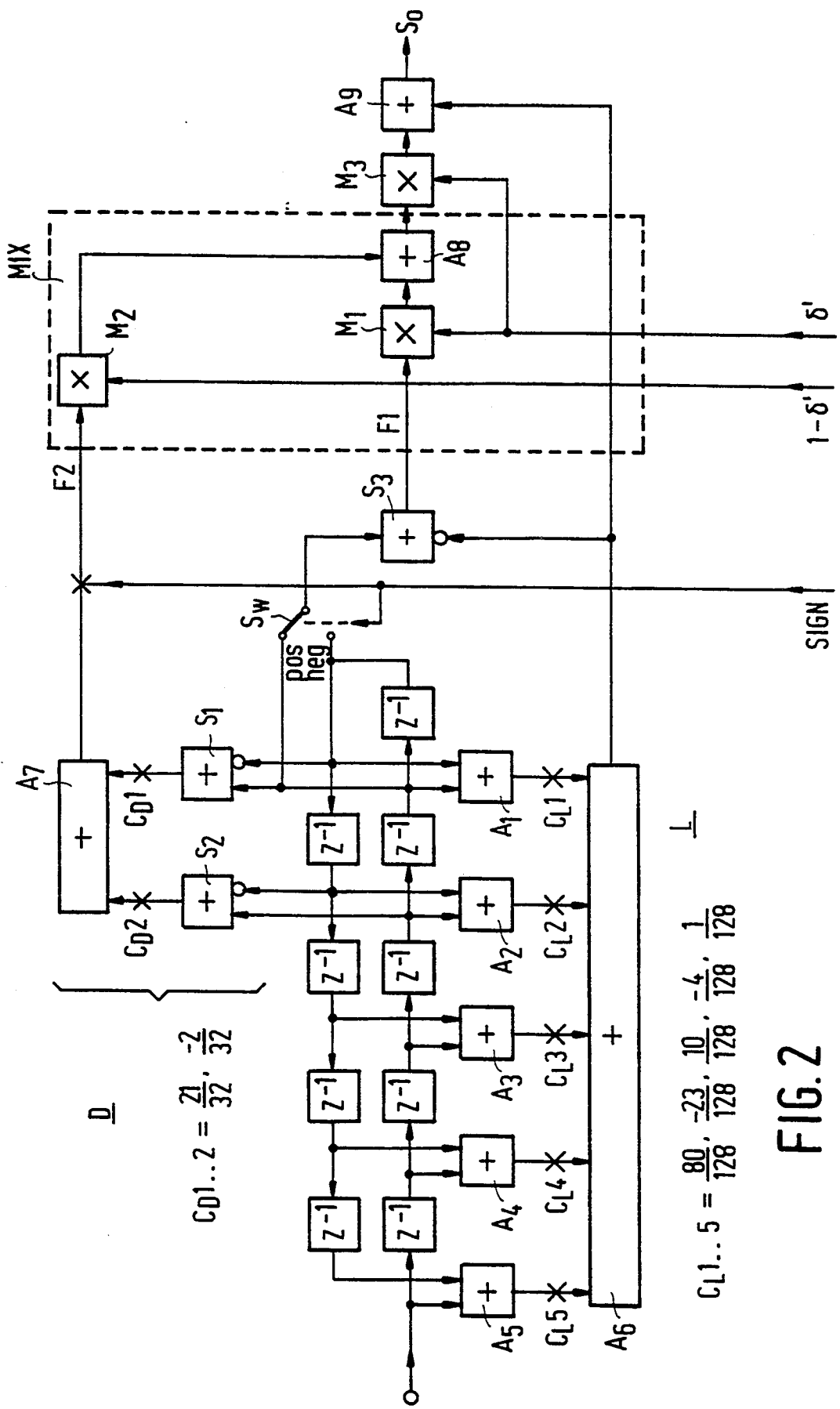
FIG. 2 shows an embodiment of a delay circuit in accordance with the above-mentioned second aspect of the invention.

FIG. 2 shows an embodiment of a delay circuit in accordance with the second aspect of the present invention, in which elements corresponding to those in FIG. 1 have been given corresponding reference symbols. Only the differences between FIGS. 1 and 2 will be discussed. In FIG. 2, the output of the low-pass filter L is connected to the inverting input of the subtracter S3 and to the input of the adder A9 which received the unfiltered sample Sn in FIG. 1. The non-inverting input of the subtracter S3 is connected to the output of the switch Sw. If the delay $\delta$ has a positive sign, the switch Sw passes the input signal of the fifth delay section of the low-pass filter L, whereas the switch Sw passes the output signal of the fifth delay section of the low-pass filter L if the delay $\delta$ has a negative sign. The inputs of the subtracter S1 are connected to the inputs of the adder A1 of the low-pass filter L. The inputs of the subtracter S2 are connected to the inputs of the adder A2 of the low-pass filter L. Thus, the differentiator D uses delay sections of the low-pass filter L rather than delay sections of its own, thereby saving three delay sections. Moreover, when this delay circuit is used in the luminance path, corresponding delays in the chrominance path are saved as well. A further advantage of the embodiment of FIG. 2 is that the performance of the differentiator D is no longer influenced by the performance of the low-pass filter L, so that they can be optimized independently of each other. In the embodiment of FIG. 2, $\delta = 0$ indicates that the output sample of the low-pass filter L is taken, which output sample is halfway between two input samples, while $\delta = 1$ indicates no delay.

Figure 3:
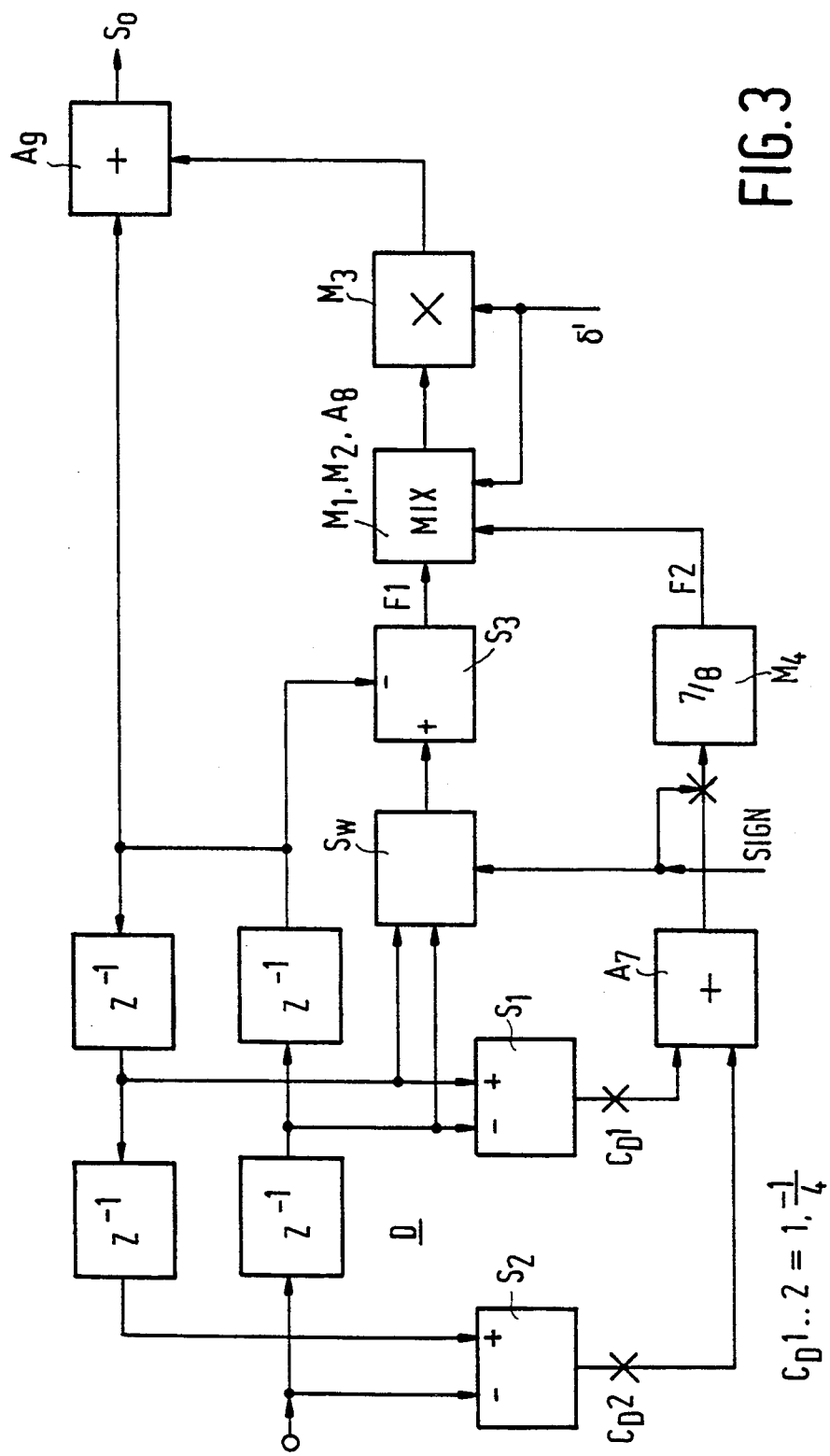
FIG. 3 shows an embodiment of a delay circuit in accordance with the above-mentioned third aspect of the invention.

FIG. 3 shows a simple third embodiment of the invention which has no low-pass filter L and which is intended for smaller bandwidths up to about one half of the half sampling frequency. Again, elements corresponding to those in FIG. 1 have been given corresponding reference symbols. Only the differences between FIGS. 1 and 3 will be discussed. The input signal is applied to a delay line having four cascaded delay sections $Z^{-1}$. The inputs of the subtracter S2 are connected to the input and the output of the delay line. The inputs of the subtracter S1 are connected to the input of the last delay section and to the output of the first delay section. The differentiator coefficients $C_D1$ and $C_D2$ are $+1$ and $-\frac{1}{4}$, respectively. The switching contacts of the switch Sw are connected to the inputs of the subtracter S1. The inverting input of the subtracter S3 and one input of the adder A9 are connected to the output of the second delay section. The output of the adder A7 is multiplied by the sign of the desired delay $\delta$, and by a factor $\frac{1}{8}$ in a multiplier M4 whose output signal F2 is applied to a mixer MIX. The mixer MIX includes the multipliers M1 and M2 and the adder A8. Another input of the mixer MIX receives the signal F1 from the subtracter S3. In the embodiment of FIG. 3, both $\delta = 0$ and $\delta = 1$ indicate that an input sample is taken; $\delta = 0.5$ indicates that the output sample is halfway between two input samples.

It should be noted that the above-mentioned embodiments illustrate rather than limit the invention, and that those skilled in the art will be able to design many alternative embodiments, without departing from the scope of the appended claims.

I claim:

1. A non-integral delay circuit for delaying a digital signal by a selectable fraction ($\delta$) of a sampling period of said digital signal, comprising:

first means for differentiating said digital signal to obtain a first differential signal (F1) having a first phase characteristic with respect to said digital signal;

second means for differentiating said digital signal to obtain a second differential signal (F2) having a second phase characteristic with respect to said digital signal; said first and second phase characteristics differing from each other;

means for combining said first (F1) and second (F2) differential signals in dependence on said selectable fraction ($\delta$) to obtain a phase-adjusted correction signal; and means for adding a product of said selectable fraction ($\delta$) and said phase-adjusted correction signal to said digital signal, to obtain said digital signal delayed by said selectable fraction ($\delta$) of the sampling period of said digital signal.

2. A non-integral delay circuit as claimed in claim 1, wherein said combining means include a mixer circuit for multiplying said first differential signal (F1) by a linearly increasing function of said selectable fraction ($\delta$) and for multiplying said second differential signal (F2) by a linearly decreasing function of said selectable fraction ($\delta$).

3. A non-integral delay circuit as claimed in claim 1, wherein said first differentiating means include a subtracter for subtracting each time two successive samples of said digital signal, and wherein said second differentiating means include a filter having an asymmetrical impulse response.

4. A non-integral delay circuit as claimed in claim 1, wherein said first differentiating means include a filter coupled to receive said digital signal to furnish an interpolated signal, and a subtracter for subtracting said interpolated signal and said digital signal from each other.

5. A non-integral delay circuit as claimed in claim 1, wherein said first and second differentiating means have substantially corresponding amplitude characteristics.

6. A non-integral delay circuit as claimed in claim 1, wherein said combining means and said adding means are preceded by digital-to-analog converters.

* * * * *